United States Patent [19]

McGrady et al.

[11] Patent Number: 4,633,331
[45] Date of Patent: Dec. 30, 1986

[54] INFORMATION SIGNAL DELAY SYSTEM UTILIZING RANDOM ACCESS MEMORY

[75] Inventors: Michael P. McGrady, Pembroke Pines; Leonard A. Brand, Jr.; Hunt K. Brand, both of Lantana, all of Fla.

[73] Assignee: Picotrin Technology, Inc., Lantana, Fla.

[21] Appl. No.: 741,941

[22] Filed: Jun. 6, 1985

[51] Int. Cl.[4] ............................................. G11B 5/00
[52] U.S. Cl. ......................................... 360/7; 360/32
[58] Field of Search .......................... 360/5, 7, 13, 32; 369/14, 60

[56] References Cited

U.S. PATENT DOCUMENTS

| | | | |
|---|---|---|---|
| 4,348,754 | 9/1982 | Haynes et al. | 369/90 |
| 4,408,309 | 10/1983 | Kiesling et al. | 360/7 |
| 4,519,008 | 5/1985 | Takenouchi et al. | 360/32 |
| 4,528,689 | 7/1985 | Katz | 360/32 |

Primary Examiner—Vincent P. Canney

Attorney, Agent, or Firm—Burns, Doane, Swecker & Mathis

[57] ABSTRACT

An information signal delay system utilizes a solid-state memory for continuously storing the information and reading it out on a time-delayed basis. An information signal is converted into a digital format and compressed using conventional compression algorithms. The compressed digital signal is then sequentially written into successive locations in a random access memory. These locations are sequentially addressed at a later point in time to read the digitized information out of the memory on a time-delayed basis relative to when it was stored in the memory. The time delay is related to the anticipated reaction time it takes to cycle completely through all of the address locations in that portion of the memory being used to store the information. The digitized information that is read out of the memory can be synthesized or otherwise suitably processed to reconstruct the original information signal as a delayed signal.

10 Claims, 4 Drawing Figures

| FIG. 2A | FIG. 2B |

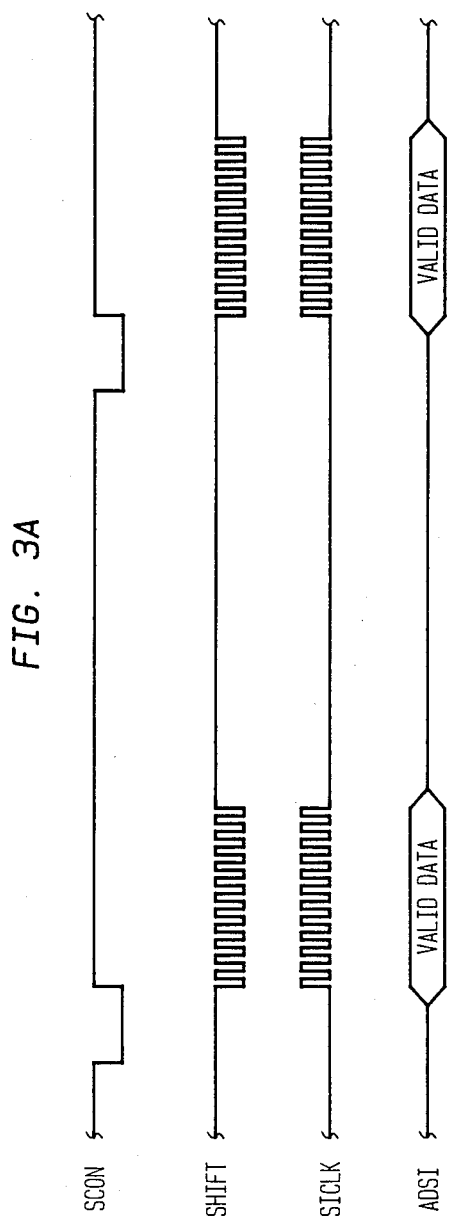

INFORMATION SIGNAL DELAY SYSTEM UTILIZING RANDOM ACCESS MEMORY

BACKGROUND OF THE INVENTION

The present invention is directed to the delay of real-time information signals, such as audio or video signals, and is particularly concerned with the selective, human responsive recording of such information signals.

There are many situations in which it is desirable to be able to selectively record information that is presented in real time. For example, in the classroom environment, a student may want to record the more significant portions of a lecture being given by an instructor. Typically, those portions of the lecture which the student deems worthy of recording might comprise only 20-30% of the total lecture. If the student uses a conventional magnetic tape recorder to record the lecture in real time by selectively turning the recorder on and off, it is likely that the first few words of each new significant portion of the lecture will be lost. This loss is due to the delay occasioned by the time it takes the student to realize that a significant topic is being discussed and to actuate the recorder. Even for students who are alertly following the lecture, this delay might be in the neighborhood of 8 seconds.

Accordingly, for fear of losing the information that is spoken during this delay period each time before the recorder is turned on, the student might leave the recorder on during the entire lecture. However, the recording of the entire lecture is undesirable since it could later require a significant amount of time to review and edit the less important segments of the recorded information from that which is desired to be retained.

Other situations which impose similar considerations include intelligence gathering operations, interviews, the video recording of newsworthy items, and the monitoring of secure areas, to name a few.

To overcome the limitations associated with selective actuation of conventional real-time recorders, various systems have been devised which provide a time-delayed recording capability. In the past, these systems have been primarily mechanical in nature, and hence subject to wear and tear and possibly eventual failure. Typically, one of these systems might consist of two magnetic tapes. One of these tapes can be in a continuous loop wherein the real-time audio information is recorded on the tape at one point in its path of travel and subsequently reproduced from the tape at a second point downstream of the recording point, so as to provide a delayed audio signal. This delayed signal can then be selectively applied to a second tape under the control of the person who desires the information so as to record an edited version of the lecture. Representative patents disclosing this general type of a time delayed recording system include U.S. Pat. Nos. 3,028,454, 3,812,530 and 4,408,309.

While the basic approach to the time delayed information recording that is employed in these types of systems is sound, it is desirable to implement this approach without the need for a mechanically based system. More particularly, it is an object of the present invention to provide a system for delaying an audio or other real-time information signal using state-of-the-art information storage technology, particularly semiconductor storage, to thereby provide a totally electronic and portable system that enables an observer to determine whether information is important before it is recorded.

BRIEF STATEMENT OF THE INVENTION

Basically, a system which operates in accordance with the present invention to delay a real-time information signal, for example to enable it to be selectively recorded or otherwise processed, is characterized by the use of a digital, addressable memory for continuously storing the information and reading it out on a time-delayed basis. As a first step in the operation of a system implementing the present invention, an audio, video or other type of information signal is converted into a digital signal if it is not already present in a digital format. If desired, the digital signal can be compressed using conventional compression algorithms. The compressed digital signal is then sequentially written into successive storage locations in an addressable memory device such as a random access memory. These locations are sequentially addressed at a later point in time to read the digitized information out of the memory on a time-delayed basis relative to when it was stored in the memory. Preferably, the time delay is related to the anticipated reaction time it takes to cycle completely through all of the address locations in that portion of the memory being used to store the information. The digitized information that is read out of the memory can then be synthesized or otherwise suitably processed to reconstruct the original information signal as a delayed signal.

Further features of the present invention and the advantages offered thereby are described hereinafter with reference to a particular embodiment of the invention illustrated in the accompanying drawings.

BRIEF DESCRIPTION OF THE DRAWINGS

FIGS. 3a and 3b are timing diagrams illustrating the relationship of various signals generated in the circuit shown in FIG. 2.

DESCRIPTION OF THE ILLUSTRATED EMBODIMENT

In the following description of a preferred embodiment of the invention, particular reference is made to the time delay of an audio signal to enable the selective recording thereof. However, it will be appreciated by those familiar with the pertinent technology that the practical applications of the invention are not so limited. For example, a delayed audio signal can be used in environments other than where it is desired to selectively record information. Furthermore, the general principles underlying the present invention are not limited to the delay of audio signals, but can be applied to any type of information signal in either an analog or digital form.

Figure 1:
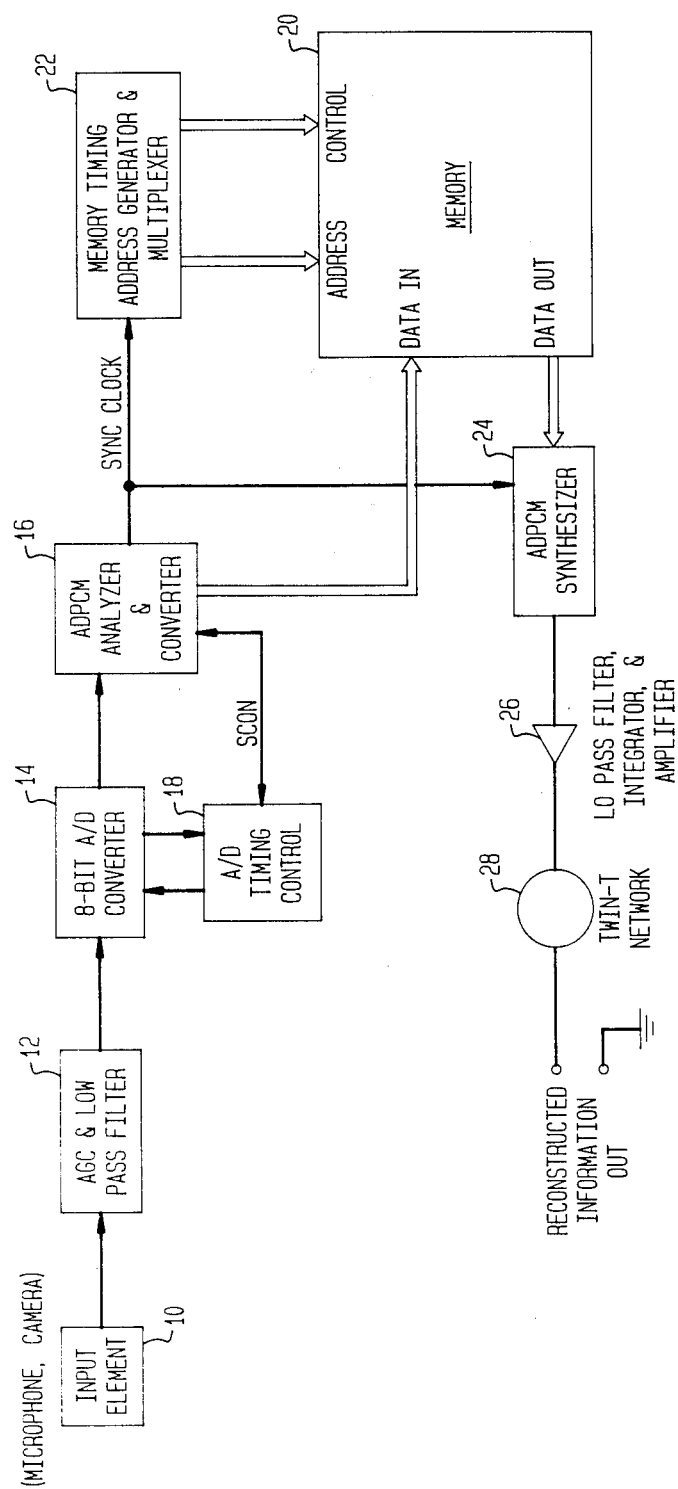
FIG. 1 is a block circuit diagram of a system for delaying a real-time audio signal.

Referring now to FIG. 1, the real-time information is entered into a selective recording system by means of an input element 10. Where the information is audio in nature, the input element can be any suitable conventional type of condenser microphone typically found in tape recorders. Similarly, to selectively record video information the input element 10 can be any suitable type of video camera. The information signal from the input element is amplified to a suitable level and filtered to remove unwanted frequencies in an AGC and low pass filter circuit 12, and then presented to an analog-to-digital (A/D) converter 14. In the converter, the analog information signal is transformed into an 8-bit digital signal for storage purposes.

In order to reduce the amount of memory required to delay a certain amount of information for a predetermined period of time, and thereby reduce cost and power requirements, the digital signal can first be compressed. To this end, the 8-bit signal from the converter 14 is presented to an adaptive differential pulse code modulator (ADPCM) analyzer. This analyzer performs a mathematical algorithm which compresses the 8-bit data into a 4-bit format. The analyzer generates a control signal SCON that is fed to a timing control circuit 18 to synchronize the output of digital information from the converter 14 with the operation of the analyzer 16.

The four-bit data that is produced by the analyzer 16 is fed to a memory unit 20. This memory unit is preferably a solid-state random access memory. However, it could be comprised of other types of addressable memories, such as a hard magnetic disk or a line-addressable CCD array. Under control of a memory timing and address generator circuit 22 that is responsive to a synchronization clock signal generated by the analyzer 16, the four-bit data is fed into sequential address locations within the memory 20. Also under control of the timing and address generator circuit 22, the stored data is subsequently read out of the memory 20 and fed to an ADPCM synthesizer 24.

More specifically, the timing and address generator circuit 22 sequentially addresses each successive storage location in the memory device 20. During the time that each location is addressed, the timing circuit 22 generates two control signals. The first control signal is a read signal which causes the information stored at the address location to be retrieved from that location and read out of the memory for presentation to the synthesizer 24. Subsequently, while that storage location is still being addressed, a write signal is generated to cause the next piece of information from the analyzer 16 to be stored in the memory at that location. Once these successive reading and writing operations have been carried out for the address location, the timing and address generator circuit 22 then generates the address for the next successive location in the memory. The address generator 22 continuously cycles through each storage location in the memory in succession, so that a given piece of information from the analyzer 16 is written into a storage location on one cycle and then retrieved from that location on the next cycle. Accordingly, the digital signal that is presented to the synthesizer 24 is delayed, relative to the time that it was fed into the memory 20, by the amount of time that it takes the address generator to cycle through the storage locations in the memory.

Thus, it will be appreciated that the time delay between reading the information into the memory and subsequently retrieving it can be varied by changing the number of addressable locations in the memory or by varying the speed at which they are addressed. Preferably, the address generator 22 is programmable so that different numbers of addressable locations in the memory can be selectively utilized in accordance with different desired time delays.

The delayed digital information that is retrieved from the memory 20 and presented to the synthesizer 24 is reconverted into an analog information signal, again using conventional algorithms. This analog signal can be smoothed and filtered in a low pass filter, integrator and amplifier network 26. Due to the conversion process that is carried out in the synthesizer 24, a sub-carrier might be introduced into the information signal. This sub-carrier can be removed in a twin-T filter network 28 which shunts the unwanted carrier frequency to ground. The information signal that is produced by the twin-T filter network is a substantially exact replica of the input signal presented to the input element 10, but delayed by the cycle time of the memory 20.

This delayed information signal can be fed to a conventional recording mechanism, e.g. a magnetic tape recorder. The selective recording of this information can be carried out by controlling the recorder in a conventional fashion. For example, if a magnetic tape recorder is employed, the tape transport mechanism can be selectively actuated to record only the desired information. Even though the information is continuously applied to the recorder, it will not be recorded during those periods of time when the recorder is disabled. Accordingly, the system enables real-time information to be selectively recorded without any loss due to the normal response time of the observer. The delay system illustrated in FIG. 1 could be integrated within a conventional recording mechanism, or it could be separate structural element that is attached to the remote input terminal of the recorder.

Figures 2, 2A:
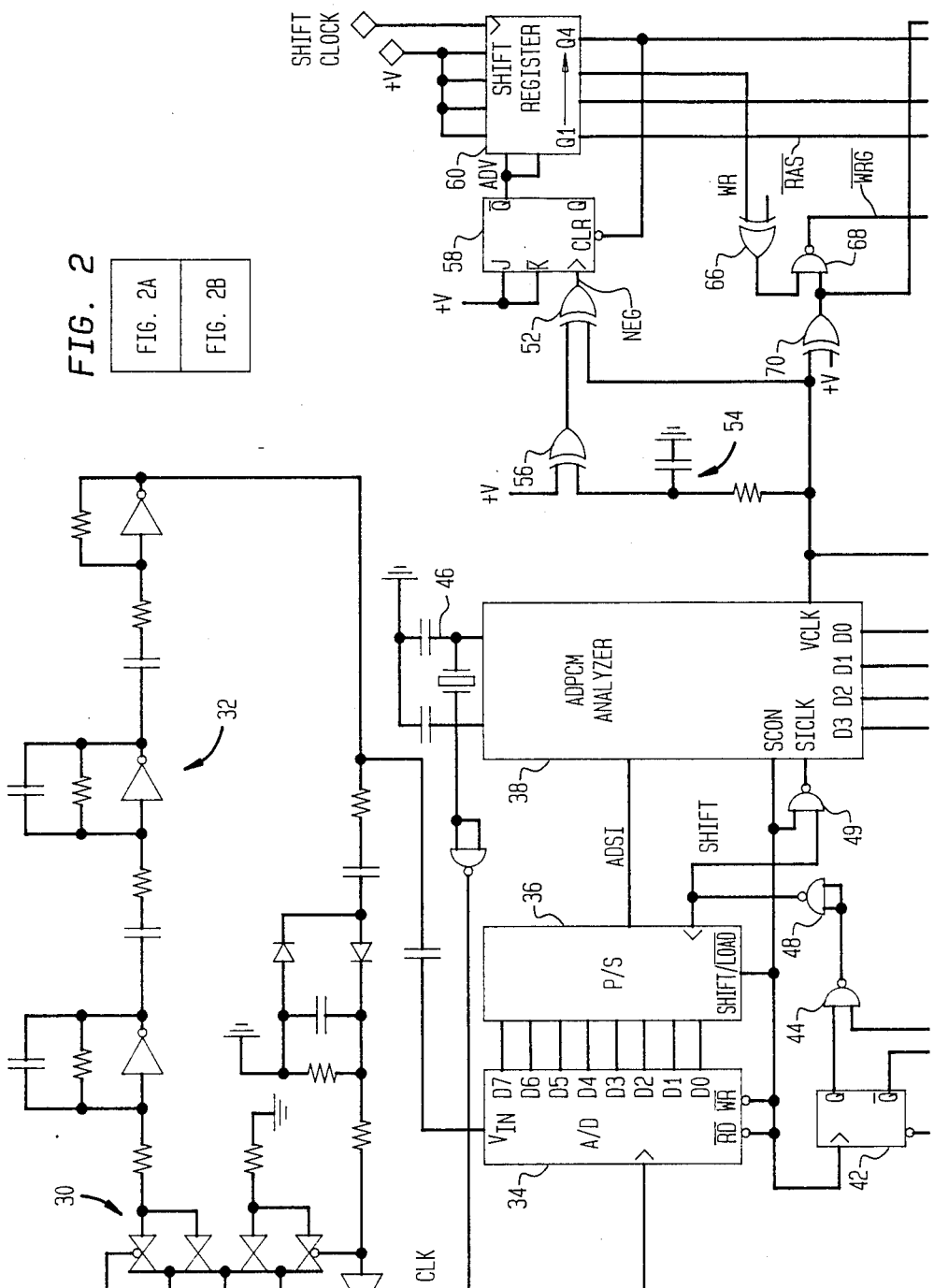
FIG. 2 consisting of FIGS. 2A and 2B is a schematic circuit diagram illustrating some of the details of the circuit depicted in FIG. 1.
Figure 2B:
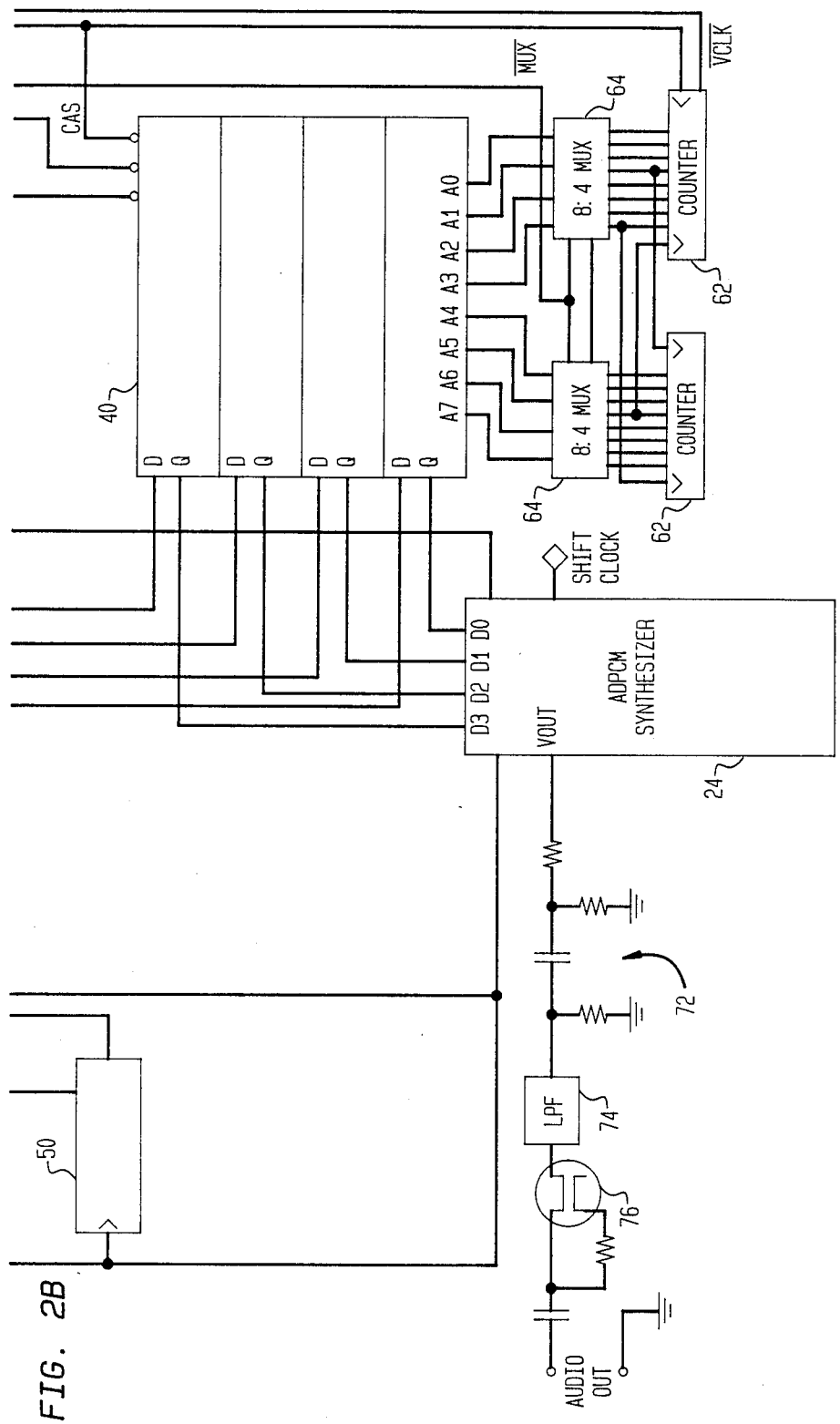

A more detailed schematic representation of the circuit described above is illustrated in FIG. 2, and its operation is described with particular reference to audio input information.

The audio output signal from the microphone 10 is fed in parallel to a plurality of transmission gates 30 configured as a two-line demultiplexer. These gates, under control of a feedback signal, selectively permit the audio signal to pass through to a 3-stage amplifier and low-pass filter network 32. The amplified and filtered output signal from the network 32 forms the feedback signal which controls the transmission gates 30. Thus, the transmission gates are selectively turned on and off in response to the amplitude of the amplified audio signal, thereby performing an automatic gain control function through limitation of the maximum amplitude signal that is passed on to the amplifiers.

The amplified and filtered audio signal is also fed to an analog-to-digital converter 34. The A/D converter 34 produces a parallel eight-bit output signal which is applied to a parallel-to-serial (P/S) shift register 36 to convert the digital signal to a serial format. The 8-bit serial, digitized audio signal ADSI is then presented to an ADPCM analyzer 38. This analyzer could be type MSM 5218RS sold by OKI Semiconductor, Inc., for example. Using a conventional algorithm, the analyzer compresses the 8-bit input signal into a 4-bit format which appears in parallel on the data output lines D0–D3. This 4-bit data signal is applied to data input terminals of a RAM memory device 40.

In addition to producing the 4-bit data signals, the analyzer 38 also generates various control signals. A start conversion timing signal SCON is applied to the read and write input terminals of the A/D converter 34 and the SHIFT/LOAD control terminal of the P/S shift register to synchronize the conversion of the audio signal and feeding of information with the operation of the analyzer. When the SCON signal is in one logic state, e.g. zero, the A/D converter 34 generates eight bits of data that are loaded into the shift register 36.

When the SCON signal is in the other state the data is shifted out of the register and into the analyzer 38.

More particularly, and with reference to the timing diagram of FIG. 3a, the change of state of the SCON signal triggers a J-K flip-flop 42, causing its Q (true) output signal to go to a logic one. This signal enables a NAND gate 44, allowing a clock signal generated by a crystal oscillator 46 to be passed through to an inverter 48 and presented as a SHIFT strobe to the trigger input of the register 36. These pulses are also inverted and presented to the analyzer 38 as a shift clock signal (SICLK) by means of a NAND gate 49 that is enabled by the SCON signal. At the same time, the $\overline{Q}$ (false) output terminal of the flip-flop 42 goes to a logic zero. This signal allows a 4-bit binary counter 50 to begin counting clock pulses. When the counter has reached a count of 12, it sends a reset signal to clear the flip-flop 42. This terminates the shift clock signal that is presented to the register 36 and the analyzer 38. When the $\overline{Q}$ (false) output signal goes to a logic one upon clearing the flip-flop 42, the counter 50 is pulsed, which preloads it with a count of two for the next cycle.

A second timing signal, VCLK, is synchronized with the output of information from the analyzer. This signal is applied to the timing and address generator circuit 22 to control the reading of information into the memory device 40.

More particularly, on the falling edge of the VCLK signal the 4-bit ADPCM data from the analyzer 38 is applied to the data input terminals of the memory unit 40. The VCLK signal is directly applied to one input terminal of an exclusive-OR gate 52 and is delayed in an RC delay circuit 54 and presented to another exclusive-OR gate 56. The two exclusive-OR gates and the delay circuit form a negative pulse generator which is triggered on both the rising and falling edges of the VCLK signal. These pulses (NEG) are applied to a negative-edge triggered flip-flop 58. Each time that the flip-flop is clocked by the negative pulses, a logic zero signal (ADV) is fed to the J-K inputs of a 4-bit parallel-in parallel-out shift register 60 whose data input terminals are all tied to a constant voltage reference.

Initially, all four of the output terminals Q1–Q4 of the register are in a logic one condition. When the logic zero ADV signal is applied from the flip-flop 58, it is shifted along to the output terminals by a shift clock signal generated by the ADPCM synthesizer 24. This shift clock signal has a frequency which is a multiple of the frequency of the VCLK signal, which multiple is determined by the size of the memory 40. When the logic zero has been shifted through to the last output terminal Q4 of the register, the flip-flop 58 is cleared. A logic one is then presented to the J-K input terminals of the register 60 and propagated to the output terminals.

The logic signals appearing at the output terminals of the register 60 control the reading and writing of information in the memory 40. Data appears at the input terminals of the memory at the falling edge of the VCLK signal. When the Q1 output terminal of the register goes to a logic zero, a row address signal RAS is strobed into the memory. The column address is strobed when the Q4 output terminal goes to a logic zero.

The actual row and column addresses are generated by a pair of cascaded 8-bit counters 62. These counters form a 16-bit address signal that is multiplexed by a pair of 8:4 multiplexers 64. When the Q2 output terminal (MUX) of the register 60 is a logic one the 8-bit row address is presented to the memory. After MUX changes to a logic zero, the column address is presented to the memory, and is strobed in when the CAS signal from the Q4 output terminal goes to zero.

The signal WR from the Q3 output terminal of the register 60 is used to provide a write pulse which strobes data into the memory. This signal is applied to one input terminal of an exclusive-OR gate 66 whose other input terminal is at a fixed logic level, e.g. one. The output signal from this gate is applied to one input terminal of a NAND gate 68. The VCLK signal is applied to one input terminal of an exclusive-OR gate 70 which functions to invert this signal. The inverted signal is applied to the other input terminal of the NAND gate 68 as well as one of the cascaded counters 62. The combination of gates 66, 68 and 70 is equivalent to an OR gate, so that an inverted write pulse $\overline{WRG}$ is applied to the memory 40 only when both the VCLK signal and the WR output signal are a logic zero.

Figure 3B:
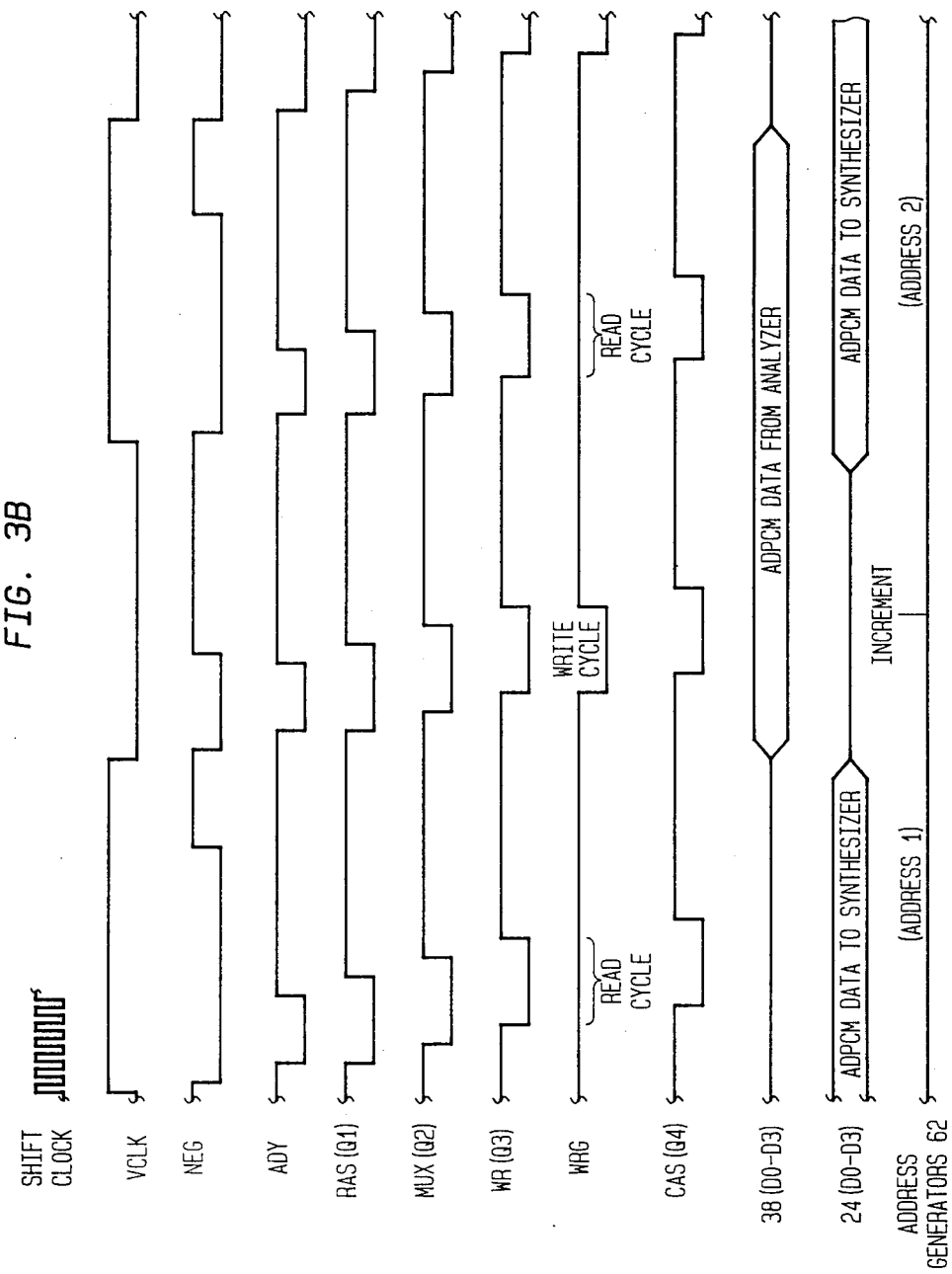

In operation, and with reference to the timing diagram of FIG. 3b, the VCLK signal goes to a logic zero and three shift clock pulses later the WR output signal of the register 60 goes to zero. At this time the write pulse is applied to the memory to begin a write cycle. This pulse remains for four more shift clock pulses and then terminates even though the VCLK signal remains low. The address generator counters 62 then advance one count on the rising edge of the column address signal CAS when the VCLK signal is a logic zero, to begin a read cycle. The sequence of operations is the same as a write cycle, except that the write pulse is not applied to the memory because the VCLK signal is a logic one. The read cycle causes data to be presented at the output terminals of the memory, where it is fed to the synthesizer 24 to be converted into a delayed audio signal. The length of the delay period is related to the number of locations that are used in the memory as well as the speed with which they are accessed. For example, if 64K 4-bit memory locations are loaded using a VCLK signal having a frequency of 8KHz, the signal will be delayed by about 8 seconds.

The resynthesized audio signal passes through a twin-T network 72 and a low pass filter 74 to smooth it and remove unwanted noise. This signal is then fed to an FET 76 which is configured as a self-biasing impedance matching device to enable it to be applied to different types of recorders.

From the foregoing it will be appreciated that the present invention provides an effective means for utilizing state of the art memory technology to delay a real-time information signal. Although described with particular reference to the delay of an audio signal to provide selective recording thereof, the practical applications of the invention are not so limited. Rather, it can be used with any type of information signal that is in a digital form, or is capable of being digitized and subsequently reconverted to its original form. For example, a digital video signal obtained from a CCD array can be directly stored in a RAM and later retrieved without the need for initial analog-to-digital conversion. In addition, both video and audio signals can be concurrently delayed using the techniques of the present invention to provide selective recording of an event on a video cassette recorder. The delay mechanism could be incorporated in the structure of the recorder itself, or it could be a separate element that receives and delays the information signals prior to presentation to the recorder.

Accordingly, it will be appreciated by those of ordinary skill in the art that the present invention can be embodied in other specific forms without departing from the spirit or essential characteristics thereof. The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. Apparatus for attachment to an operator-actuated audio tape recorder to enable a real-time audio signal to be selectively recorded on a delayed basis, comprising:
   a microphone for receiving the audio signal and producing an electrical signal related thereto;
   means for converting the electrical signal into a digital signal;
   a solid-state memory device having a plurality of addressable storage locations for storing the digital signal;
   an address generator for sequentially addressing each of said storage locations in synchronism with the digital signal from said converting means;
   control means for causing said memory device to read out information stored at an addressed location and subsequently store the digital signal from said converting means at that location;
   synthesizing means for receiving digital information read out of said memory device and converting said information into an analog signal; and
   output means for connection to an audio tape recorder to couple the analog signal from said synthesizing means to the recorder.

2. The apparatus of claim 1 wherein said address generator continuously cycles through each of the storage locations in said memory device.

3. The apparatus of claim 1 wherein said converting means produces a digital signal having a predetermined number of bits, and further including means for compressing said digital signal into a format having a smaller number of bits.

4. Apparatus for enabling an audio input signal to be selectively edited and recorded in real time, comprising:
   an operator-actuated audio tape recorder;
   an analog-to-digital converter for receiving the audio input signal and producing a digital signal having a predetermined number of bits;
   means for compressing said digital signal into a format having a smaller number of bits;
   a memory unit having a plurality of addressable storage locations for storing the compressed digital signal;
   means for controlling said memory unit to continually store the compressed signal in a sequential manner in each of said storage locations and to continually read out the stored signal a predetermined time period after storage at each location;
   means for receiving the stored signal read from said memory and expanding it to a digitized signal having said predetermined number of bits; and
   means for synthesizing the digitized signal to produce an audio output signal and for feeding said audio output signal to said tape recorder.

5. The apparatus of claim 4 wherein said controlling means sequentially addresses each storage location in the memory unit and during each address first causes the data stored at that location to be read out of the memory and then causes a new piece of data from said compressing means to be stored at that location.

6. The apparatus of claim 5 wherein said controlling means continuously cycles through each of the storage locations in said memory unit during said sequential addressing.

7. The apparatus of claim 4 wherein said memory unit is a solid-state random access memory.

8. The apparatus of claim 4 wherein said compressing means comprises an adaptive differential pulse code modulator.

9. A system for providing delayed selective recording of a real-time audio signal, comprising:
   an audio tape recorder having an operator actuated tape transport mechanism and an imput terminal that receives signals to be recorded on a tape; and
   an input device that is separate from said tape recorder and that is adapted to be removable connected to said input terminal to present signals to be recorded on the tape, said input device including
   means for converting an audio signal into a digital signal;
   a solid-state memory device having a plurality of addressable storage locations for storing the digital signal;
   an address generator for sequentially addressing each of said storage locations in synchronism with the digital signal from said converting means;
   control means for causing said memory device to read out information stored at an addressed location and subsequently store the digital signal from said converting means at that location;
   synthesizing means for receiving stored information read out of said memory device and converting said information into an audio signal; and
   means for connection to said input terminal of said tape recorder to present said audio signal therto.

10. The system of claim 9 wherein said converting means includes means for converting the audio signal into a first signal having a predetermined number of bits and further includes means for compressing the first signal into a second signal having a fewer number of bits, said second signal being the digital signal which is stored in said memory device, and wherein said synthesizing means includes means for expanding information read from said memory device into a digital signal having said predetermined number of bits.

* * * * *